United States Patent
Dengler et al.

(10) Patent No.: US 10,680,580 B2
(45) Date of Patent: Jun. 9, 2020

(54) SAW FILTER WITH A LARGE BANDWIDTH

(71) Applicant: SNAPTRACK, INC., San Diego, CA (US)

(72) Inventors: Thomas Dengler, Munich (DE); Thomas Bauer, San Diego, CA (US)

(73) Assignee: SnapTrack, Inc., San Diego, CA (US)

(*) Notice: Subject to any disclaimer, the term of this patent is extended or adjusted under 35 U.S.C. 154(b) by 0 days.

(21) Appl. No.: 16/086,346

(22) PCT Filed: Apr. 5, 2017

(86) PCT No.: PCT/US2017/026096
§ 371 (c)(1),
(2) Date: Sep. 19, 2018

(87) PCT Pub. No.: WO2017/176856
PCT Pub. Date: Oct. 12, 2017

(65) Prior Publication Data
US 2019/0089333 A1 Mar. 21, 2019

(30) Foreign Application Priority Data
Apr. 5, 2016 (DE) .................. 10 2016 106 185

(51) Int. Cl.
*H03H 9/64* (2006.01)
*H03H 9/145* (2006.01)
*H03H 9/00* (2006.01)

(52) U.S. Cl.
CPC ........ *H03H 9/6433* (2013.01); *H03H 9/0052* (2013.01); *H03H 9/0066* (2013.01); *H03H 9/0085* (2013.01); *H03H 9/14514* (2013.01)

(58) Field of Classification Search
CPC ........ H03H 9/64; H03H 9/6433; H03H 9/644; H03H 9/145
USPC .................................................. 333/193, 195
See application file for complete search history.

(56) References Cited

U.S. PATENT DOCUMENTS

| | | | |
|---|---|---|---|
| 5,428,814 A | 6/1995 | Mort et al. | |
| 5,581,141 A * | 12/1996 | Yamada | H03H 9/0028 310/313 B |
| 5,790,000 A * | 8/1998 | Dai | H03H 9/0038 310/313 B |
| 6,670,868 B2 * | 12/2003 | Kawase | H03H 9/1071 310/313 D |

(Continued)

FOREIGN PATENT DOCUMENTS

EP 1482639 A2 12/2004
JP 3476299 B2 12/2003

(Continued)

OTHER PUBLICATIONS

International Search Report and Written Opinion for PCT/US2017/026096, dated Jul. 18, 2017.

*Primary Examiner* — Dean O Takaoka
(74) *Attorney, Agent, or Firm* — Patterson & Sheridan, LLP (57) ABSTRACT

A filter arrangement with a large bandwidth is specified, wherein a first and a second filter are connected in parallel between a first and a second node. Both filters are configured as DMS filters and both comprise two DMS tracks each, connected in series. The two filters have different center frequencies and create a common passband together.

9 Claims, 5 Drawing Sheets

(56) References Cited

U.S. PATENT DOCUMENTS

| | | | | |
|---|---|---|---|---|
| 6,900,577 | B2* | 5/2005 | Takamine | H03H 9/0028 |
| | | | | 310/313 D |
| 6,906,602 | B2* | 6/2005 | Kidoh | H03H 9/6426 |
| | | | | 310/313 B |
| 7,212,086 | B2* | 5/2007 | Nishizawa | H03H 9/0028 |
| | | | | 333/193 |
| 7,795,999 | B2* | 9/2010 | Kaneda | H03H 9/6476 |
| | | | | 333/193 |
| 9,178,490 | B2* | 11/2015 | Detlefsen | H03H 9/0038 |
| 2003/0169129 | A1 | 9/2003 | Takamine et al. | |
| 2010/0045397 | A1 | 2/2010 | Kloska et al. | |
| 2010/0219912 | A1* | 9/2010 | Tanaka | H03H 9/0038 |
| | | | | 333/195 |
| 2012/0001727 | A1* | 1/2012 | Telgmann | H03H 9/6433 |
| | | | | 340/5.64 |
| 2014/0167881 | A1 | 6/2014 | Iwasaki et al. | |

FOREIGN PATENT DOCUMENTS

| | | |
|---|---|---|
| JP | 2012222659 A | 11/2012 |
| JP | 2013197772 A | 9/2013 |

* cited by examiner

SAW FILTER WITH A LARGE BANDWIDTH

CROSS-REFERENCE TO RELATED APPLICATIONS

This application is a national stage application under 35 U.S.C. 371 of PCT/US2017/026096, filed Apr. 5, 2017, which claims the benefit of German Patent Application Serial No. 10 2016 106 185.9, filed on Apr. 5, 2016, both of which are incorporated herein by reference in their entireties.

BACKGROUND

Filters that can be used as receive filters must have minimal insertion loss in the pass band, must suppress the respective counter band or bands to a maximum degree and be adapted with respect to the impedance. The bandwidth of the passband is a further parameter of a filter.

For particularly broad frequency bands of e.g. over 4%, a good impedance adjustment over the entire bandwidth is very difficult to realize. Known solutions usually lead to an insertion loss that is too high and an edge steepness that is too low, which makes the suppression of the counter band difficult or even impossible, if the counter band is directly adjacent to it. For covering a particularly broad reception band, therefore e.g. two filters were used, which divided the broad band into two sub-bands that were respectively allocated to an own filter each, which filter could be selected via switches as required.

The operational mode "Carrier Aggregation"—or CA mode—is increasingly gaining importance for future mobile radio applications. It involves parallel data transmission in two different bands for increasing the bandwidth of a call connection. For Carrier Aggregation, frequency bands with a bigger frequency spacing are used in particular. This facilitates multiplexing and prevents any acoustic disruptive effects, which one filter can create in the band of the respective other filter. Thus, a simultaneous operation of both filters with good adaptation is possible. For bands that are closer to one another, it is sometimes required to use one filter with a very large bandwidth, which captures both bands, whereby, however, the separation of the two bands from each other is often very difficult to achieve.

DETAILED DESCRIPTION

The task of the present invention is to specify a SAW filter with a large bandwidth, which has a sufficient edge steepness and low insertion loss.

This task is solved by a filter arrangement according to claim 1. Advantageous embodiments of the invention as well as an advantageous use of the filter arrangement are contained in the sub-claims.

The fundamental idea of the invention comprises the following: for creating the broad passband, two filters with smaller bandwidths connected in parallel are used, wherein the center frequencies of the filters differ from each other, so that the two passbands of the individual filters complement each other to form the broader passband of the filter arrangement. Thus, the two filters connected in parallel between a first and a second node create a common broader passband.

Both filters according to the invention are configured as DMS filters and both comprise two DMS tracks each that are connected in series. This allows to design a filter arrangement having a passband with a bandwidth of 4% and more. At the same time, the filter arrangement displays only low insertion loss making it well suitable for use with mobile radio bands. Even bandwidths of 8% and more can be achieved by means of this filter arrangement.

In one embodiment of the invention, a serial resonator is connected in series to the two filters. The resonator can be configured using any technology, however, it is preferably formed according to SAW technology, e.g. as a one-port resonator. These are high-quality resonators that have a defined spacing between resonance and anti-resonance. If the resonator is selected such that its resonance is in close proximity to a passband edge of the filter arrangement, a steeper passband edge can be achieved in a beneficial manner. This is particularly beneficial, because DMS filters have a relatively flat right passband edge. Therefore, a serial resonator is advantageously used, whose resonant frequency lies in close proximity to the right passband edge.

The serial resonator does not have to be configured as a SAW resonator but can be any resonator, which is realized from concentrated L and C elements or from discrete capacitances and inductances.

Preferably, both DMS filters and the serial resonator are formed on a common substrate. This results in a filter arrangement that has very small geometrical dimensions.

In a further embodiment of the invention, the DMS tracks in each of the two filters are connected to each other via two or more coupling converters. In doing so, it is beneficial for the two coupling converters to be configured with regard to their finger connection sequence such that they can operate in anti-phase. In anti-phase means here that the signals transmitted via the coupling lines are symmetrical to each other in both coupling lines concerning their amount but lie on the opposing potential. In this way it is possible to connect the earth connections of the two coupling converters directly with each other, so that they comprise a virtual ground, which is fully functional without any connection with an external potential or an external earth terminal. Such a design is characterized by the fact that only very small or no ground currents are flowing, which currents otherwise would have to be discharged via a housing. Furthermore, interconnections are avoided and power losses are reduced in this way. In addition, every omission of an external contact results in cost benefits and also allows for a reduction of the required chip surface.

In one embodiment of the invention, the two filters are configured as SAW metallizations on a lithium niobate substrate and covered by a dielectric covering layer. Such a design is characterized by the fact that the frequency temperature coefficient (TCF) of the filter can be minimized or entirely compensated in this way. This is achieved, in particular, by selecting the dielectric covering layer that is made of a material, which has a lower or opposite temperature coefficient (TCF) than that of the substrate. Therefore, a suitable dielectric covering layer consists of $SiO_2$ and/or a layer sequence that comprises $SiO_2$. It is advantageous to cover the $SiO_2$ layer with a passivation layer, a silicon nitride layer, for example.

In an advantageous embodiment, the edge steepness of the filter arrangement is further improved. This is achieved by coupling the coupling converters of a DMS track via parallel capacitances with the respective input or output converter of the same DMS track.

In case of a DMS filter with three converters, having one input converter and two coupling converters, e.g. two parallel capacitances are required, in order to connect the input converter and/or output converter with one of the coupling converters respectively.

It is advantageous to also connect the converters of the second DMS track of the same filter via parallel capacitances respectively. In this way, in particular the right passband edge can be made steeper.

However, as the filter arrangement according to the invention requires only the right passband edge of the entire arrangement to be adjusted in a steep manner, it suffices to interconnect only the connectors of the filter with the higher center frequency, as the right passband edge of that filter also determines the right edge of the entire filter arrangement.

In a further embodiment of the invention, for adjusting the capacitive load, each of the two nodes of the filter arrangement is connected to ground in parallel with one coil respectively. In this way, a good impedance adjustment can be achieved, if coils with a suitable inductance are selected.

As already mentioned, the right passband edge of the DMS filter can be made steeper by way of an increased coupling of the DMS track converters. The capacitive coupling can be achieved by way of parallel capacitances, which are configured as discrete capacitances. However, it is also possible to increase the direct coupling of the converters with each other. The most direct coupling is created by directly adjacent electrode fingers of adjacent converters. In one embodiment according to the invention, the potential difference between two such adjacent, terminal electrode fingers of different converters is increased. The highest degree of capacitive coupling is achieved, when both terminal electrode fingers are "hot" and thus lead to potential and are not connected to ground. With such a design it is possible to reduce the capacitance of the parallel capacitances of a capacitive interconnection while having effectively the same capacitive interconnection, without being able to entirely do without parallel capacitances, if a sufficiently steep right passband edge is to be maintained.

The two nodes, between which the first and the second filters are connected in parallel, are sufficient, if the filter arrangement is operated in an imbalanced manner on both sides. However, it is also possible to configure the filter arrangement such that it can be operated in a balanced manner, on one side. For that, it is usually required to provide for a higher amount of interdigital converters per DMS track.

A DMS track comprises a minimum of two converters, each of them serving at least as an input and output converter respectively. In a two-track design, at least one serves as input converter and one as output converter, while at least one of the other converters is provided as a coupling converter.

In principle, as few as three interdigital converters per DMS track can be sufficient for achieving a balanced behavior at one port. However, it is advantageous to provide for five, six, seven or more converters, preferably an uneven number of interdigital converters, per DMS track. Then the input signal or the output signal can be tapped at two input converters or output converters, without the risk of bigger imbalances occurring with regard to phase and/or magnitude of the signal. A further advantage of employing a higher number of converters lies in the fact that the aperture can then be made smaller, which reduces the finger resistance losses.

As a result, more than 3 converters per DMS track make for a filter arrangement that can be operated unbalanced on one side and balanced on the other side. Then, the filter arrangement is connected between one first node and two second nodes, both of which together form the balanced connection.

The filter arrangement according to the invention makes such a broad passband available, that two closely adjacent mobile bands can be covered by it simultaneously. Thus, it is possible to use both of these mobile radio bands for a Carrier Aggregation Mode, and in doing so, to simultaneously transmit signals in both mobile radio bands and receive them with the filter arrangement according to the invention, which outwardly behaves as one single filter.

A further advantage of the filter arrangement with regard to such a CA operation lies in the fact that it has steep edges on both sides, but particularly on the right side, which results in a good suppression of adjacent bands. This is especially advantageous for Carrier Aggregation mode, as the latter usually involves two additional Tx bands provided in a small spacing on both sides of the filter arrangement passband, which filter arrangement here serves as a receive filter in particular. This TX band needs to be suppressed by the inventive filter or the inventive filter arrangement. Hence, the filter arrangement according to the invention is best applied in CA mode in the two adjacent mobile radio bands 28a and 20, which are both Rx bands.

The invention is explained in more detail below with reference to embodiments and the associated figures. The figures are mostly schematic and designed as block diagrams, so that no absolute or relative dimensional specifications can be inferred from them. On the contrary, individual parts can be depicted in the figures in an enlarged, reduced or distorted manner.

Figure 1:
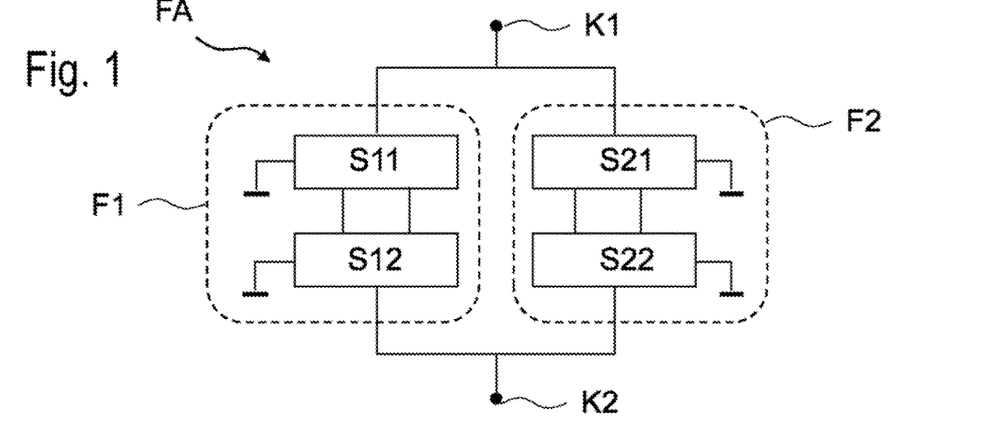
FIG. 1 illustrates a simple embodiment of a filter arrangement according to the invention.

FIG. 1 shows a simple embodiment of a filter arrangement FA according to the invention in schematic representation. Between a first node K1 and a second node K2, a first filter F1 and a second filter F2 are connected in parallel. Each of the filters comprises a first and a second DMS track S11, S12 and/or S21, S22 connected in series. Depicted is the minimum amount of signal transmitting lines required for the filter arrangement, while the earth terminals are only depicted schematically.

Figure 2:
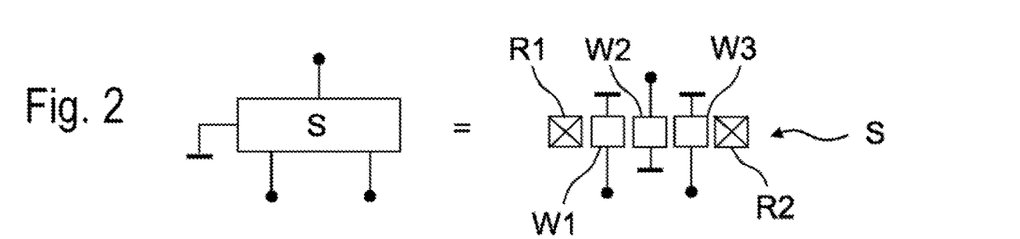
FIG. 2 illustrates the structure of a DMS track.

FIG. 2 shows a block diagram of a possible structure of a DMS track S in detail. Such a DMS track S comprises at least one first and one second reflector R1, R2, which delimit the acoustic track in longitudinal direction. Three converters W1, W2, W3 are arranged side by side in the acoustic track. When two DMS tracks S are connected to form the filter arrangement FA, the central, second converter W2 serves as input and/or output converter, while the two outer converters W1 and W3 are configured as coupling converters and connected with the two corresponding coupling converters of the next track.

Figure 3:
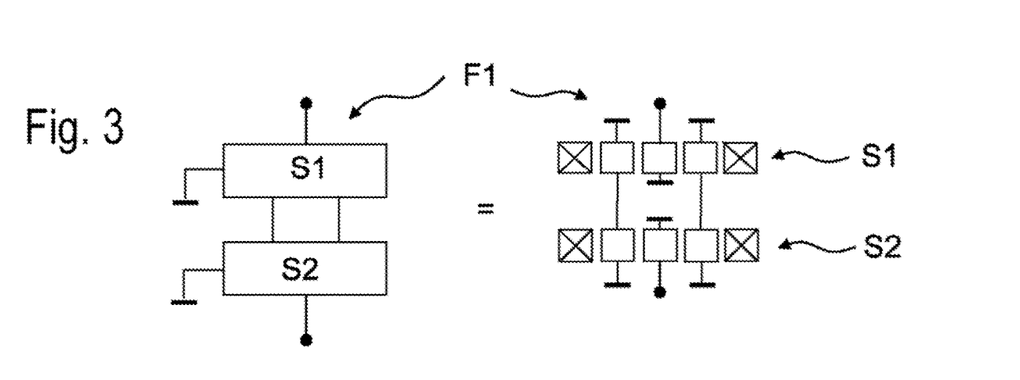
FIG. 3 illustrates the wiring of two DMS tracks.

FIG. 3 shows in detail the wiring of the converters W of the two DMS tracks S1, S2 to form a DMS filter, e.g. the filter F1.

FIG. 4 shows again a filter, for example the filter F1, of the inventive filter arrangement, where the different converters are coupled with each other via parallel capacitances C1 to C4.

Figure 4:
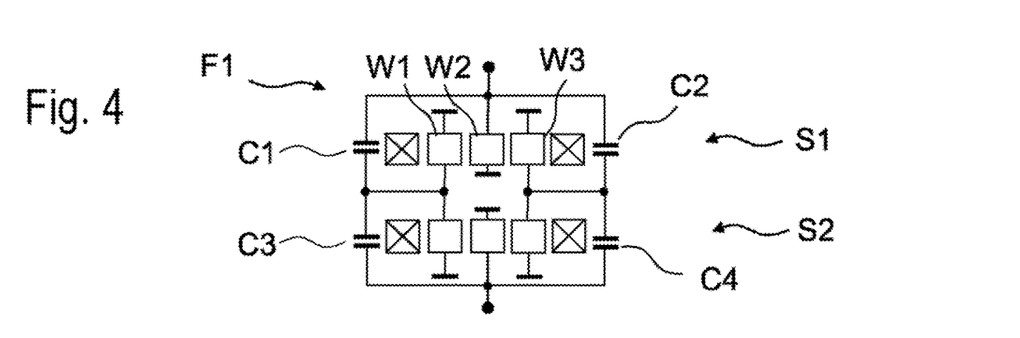
FIG. 4 illustrates one individual DMS filter where the converters of the DMS tracks are coupled via parallel capacitances.

Thus, for example, the input or output converter W2 of the first track S1 is arranged in the center and is coupled with the left coupling converter W1 of the first track via a first parallel capacitance C1. In a similar way, the input or output converter of the first track S1 is coupled with the other (right) coupling converter W3 via a second parallel capacitance C2. In the same way, the central converter of the second track S2 is coupled with the left coupling converter via a third parallel capacitance C3 and with the right coupling converter via a fourth parallel capacitance C4 of the second DMS track S2.

The DMS filter shown in FIG. 4 can, for example, be used as a first DMS filter F1 of the filter arrangement of FIG. 1. The second filter F2, whose center frequency f2 is lower than the center frequency f1 of the first DMS filter F1, is configured without any parallel capacitances, as these are not required for the deeper filter that is not forming the right edge.

For an exemplary embodiment, parallel capacitances with the following values are used: C1=0.05 pF; C2=0.25 pF; C3=0.25 pF; C4=0.15 pF.

Figure 5:
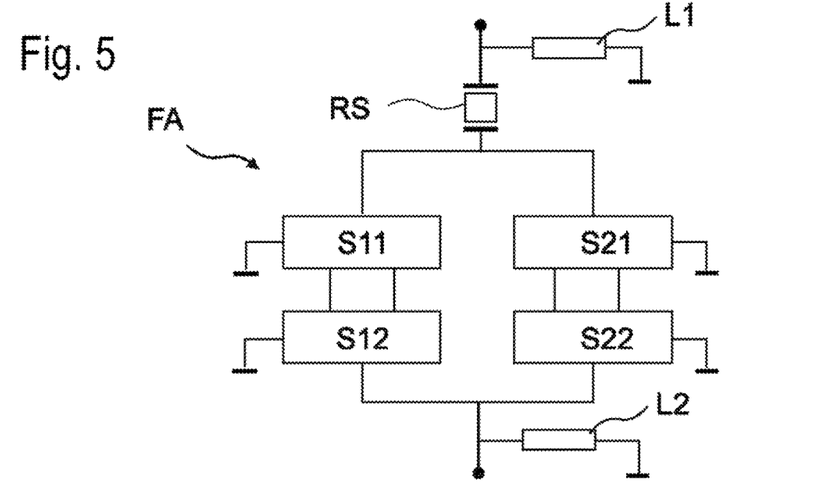
FIG. 5 illustrates a filter arrangement with a serial resonator and parallel coils.

FIG. 5 shows a filter arrangement according to the invention having further connecting elements. Here, a serial resonator RS is connected to one of the nodes. However, it is also possible to connect the serial resonator directly in series to the Filter F1, but not between the node and the second filter F2. Furthermore, in order to adjust the impedance of the filter arrangement over its entire bandwidth, two coils L1, L2 are respectively connected in parallel to ground near each node K parallel to the filter arrangement. In one exemplary embodiment, two identical coils with the following values are used:

$L1=L2=13$ nH.

In an embodiment not depicted here, one first filter F1, designed as shown in FIG. 4, is connected with a second filter F2 in parallel, which is designed as shown in FIG. 3. In addition, the same connecting elements as shown in the exemplary embodiment according to FIG. 5, i.e. one serial resonator and parallel coils, are connected to the filter arrangement.

Figure 6:
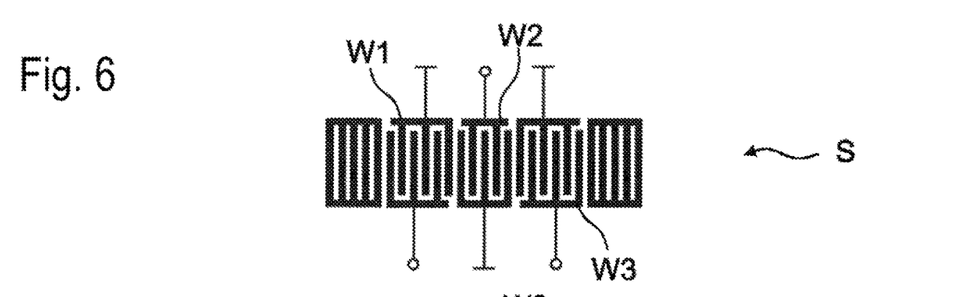
FIG. 6 illustrates a DMS track, where adjacent, terminal converter fingers are connected to ground.

FIG. 6 shows a schematic representation of an exemplary metallization of a DMS track S, whereby the individual converters are depicted having less converter fingers than they would have in a real configuration. In FIG. 6, the finger connection sequence, i.e. the allocation of the respective fingers to the corresponding potential and/or the corresponding connection, is configured such that terminal converter fingers from the first converter W1 and the second converter W2, which are directly adjacent to each other in the DMS track, are both connected to ground. In this manner, a minimal capacitive coupling between the first and the second converter W1 and W2 is achieved. The terminal electrode fingers at the transition between the second converter W2 and the third converter W3 are both also connected to ground.

Figure 7:
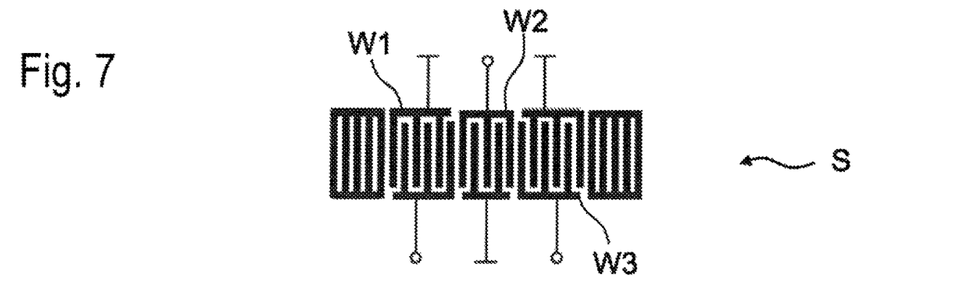
FIG. 7 illustrates a DMS track, where the terminal electrode fingers that are arranged opposite each other are connected to potential.

The finger connection sequence of the DMS track S in FIG. 7 is configured such that at the converter transition between the first converter W1 and the second converter W2 both terminal fingers are connected to the potential and can thus be designated as so called hot fingers. The same applies to the terminal fingers at the converter transition from the second converter W2 to the third converter W3.

Figure 8:
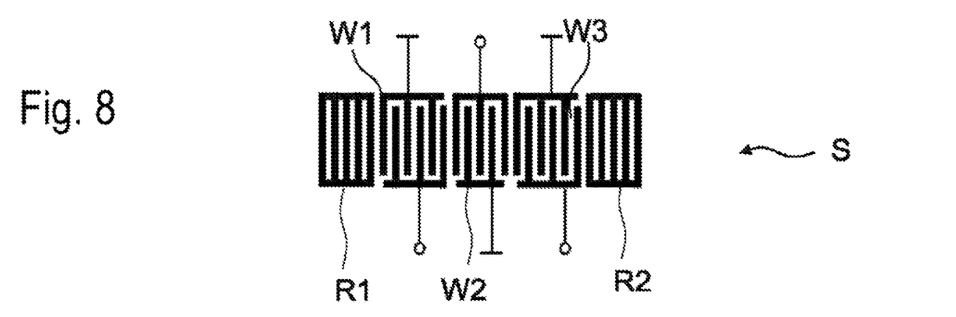
FIG. 8 illustrates a DMS track, which allows an anti-phase operation at the coupling converters.

FIG. 8 shows a DMS track S, where the connections of the two coupling converters W1, W3 deliver anti-phase signals, so that the two coupling converters can be operated in push-pull mode. This is achieved by mirroring one of the two coupling converters, e.g. from the DMS track of FIG. 7, relative to the other coupling converter about a longitudinal axis, whereby the finger connection sequence is swapped.

Figure 9:
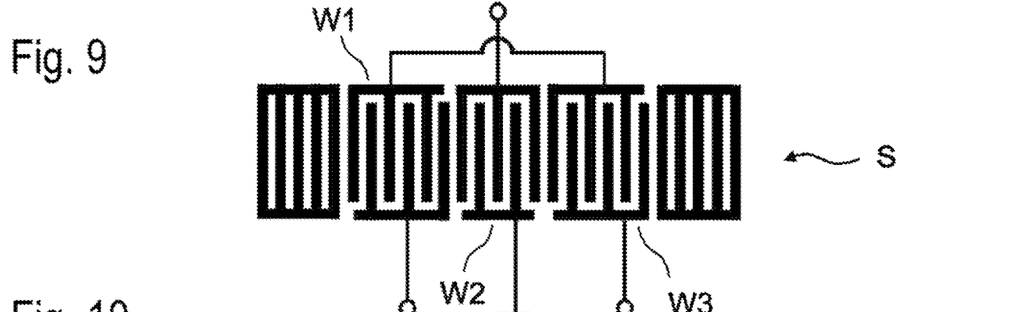
FIG. 9 illustrates a DMS track that allows anti-phase operation, where the earth connections of the coupling converters are configured as virtual ground.

While in FIG. 8, despite the anti-phase operation, each of the two coupling converters is provided with its own earth connection, in the DMS track of FIG. 9, these two earth connections are only connected to each other, thus comprising a virtual ground without any external connection to ground. This DMS track has a reduced amount of connections compared to the one in FIG. 8. Practically no external earth currents can flow, the line lengths are reduced and contact surfaces for the ground connections are dispensed.

Figure 10:
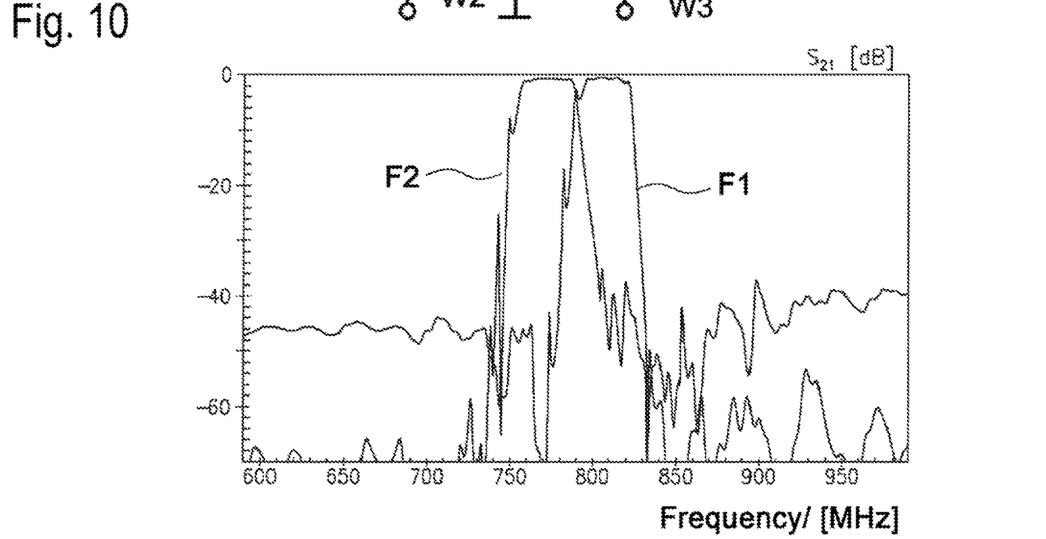
FIG. 10 illustrates the two superimposed transmission curves of the two interconnected filters in the filter arrangement, here, however, in not connected state.

FIG. 10 shows the matrix element S21, which depicts the transmission curves of the two filters F1 and F2 that can be connected to each other to form a filter arrangement according to the invention. Both filters have the same or a similar bandwidth and are oriented towards each other regarding their center frequencies in such a way that the passband edges facing each other lie approximately at the same frequency, so that the two passbands directly abut against each other. In FIG. 10, the passbands are shown in an isolated state, with filters F1 and F2 not interconnected. The filter arrangement is configured for a frequency band that comprises the mobile radio bands B 28A and B 20.

Figure 11:
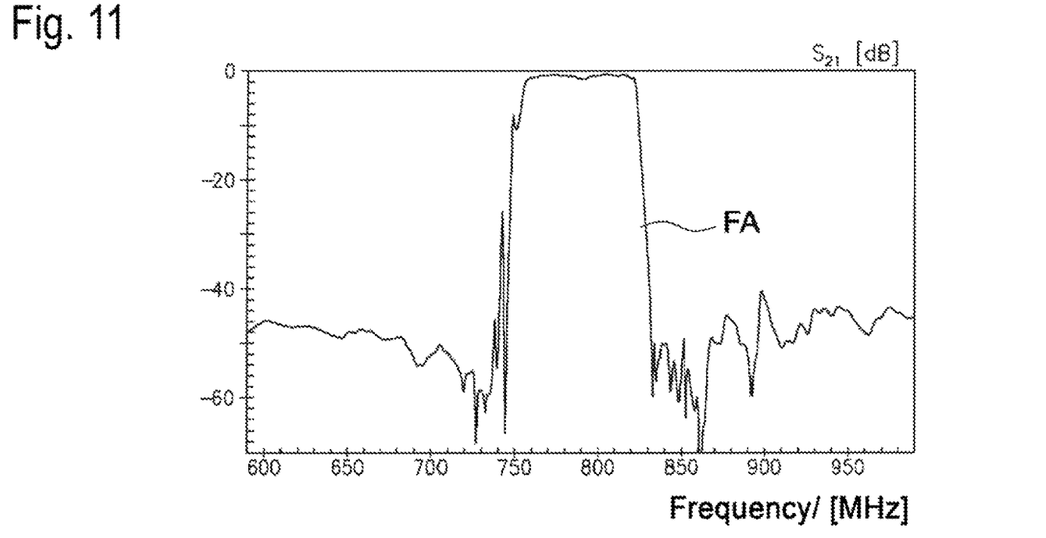
FIG. 11 illustrates the transmission curve of a filter arrangement according to the invention.

FIG. 11 now shows the passband of the filter arrangement FA, where the two individual passbands shown in FIG. 10 combine to form a large and broad passband of over 8% bandwidth. As an exemplary embodiment, a filter is shown that covers the mobile radio bands 28a and 20. In addition, the figure shows that the filter arrangement has a good, i.e. sufficiently low, insertion loss, is provided with steep edges, particularly on the right side, and delivers a sufficient suppression in the stop band on both sides of the passband.

Figure 12:
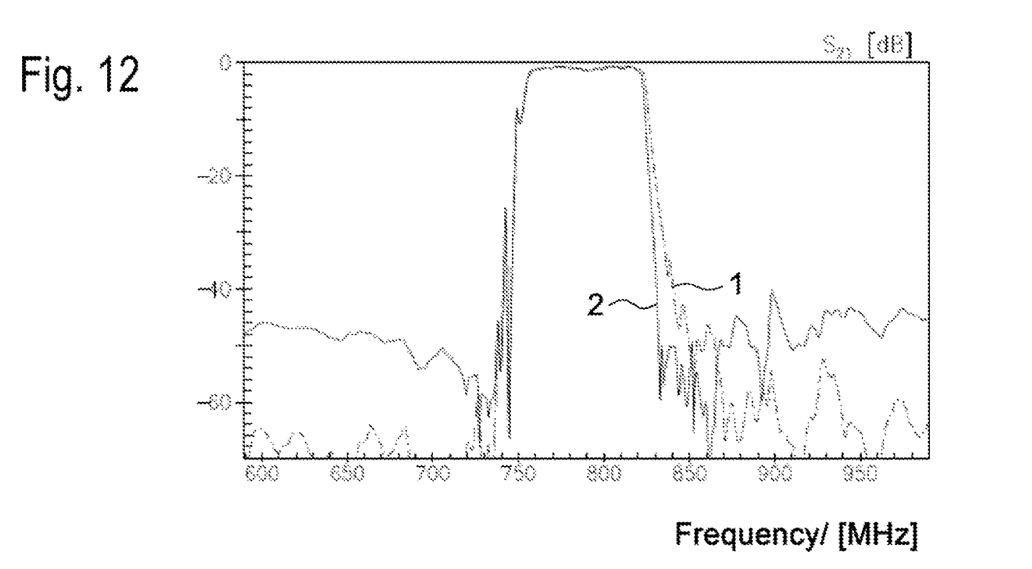
FIG. 12 illustrates the superimposed transmission curves of two inventive filter arrangements, one being configured with parallel capacitances and one without.

FIG. 12 shows the superimposed transmission curves of two exemplary embodiments. While curve 1 shows the transmission function of a filter arrangement having no parallel capacitances, curve 2 shows the corresponding transmission behavior of an otherwise identically designed embodiment with parallel capacitances. The figure shows that the right edge of curve 2 of the filter arrangement with parallel capacitances is significantly steeper than curve 1 of the filter arrangement without any parallel capacitances.

Figure 13:
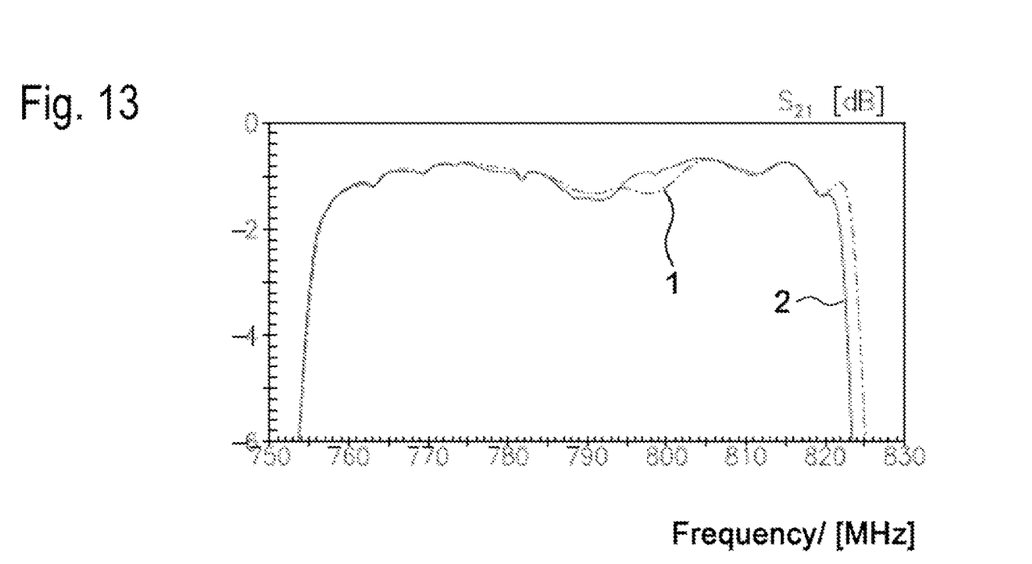
FIG. 13 illustrates a section of the transmission curves of FIG. 12.

FIG. 13 shows an enlarged view of a section of the passband region of FIG. 12. Here, it also turns out that the parallel capacitances exert practically no impact on the insertion loss and/or do not aggravate it. The damping in the stop band is slightly lower, but the benefit of the steep edge by far surpasses that in all instances, where a closely adjacent band has to be suppressed.

Figure 14:
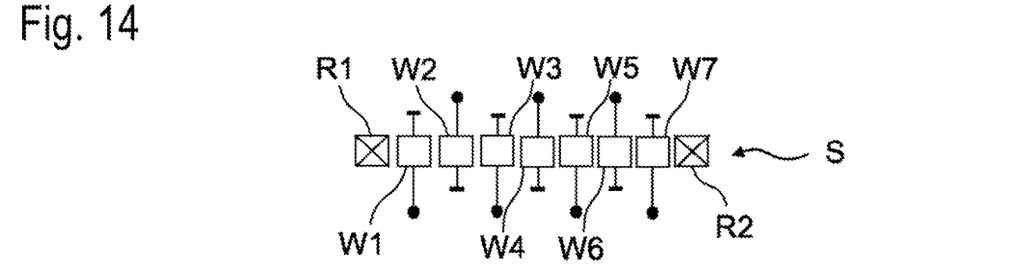
FIG. 14 illustrates a DMS track with seven converters.

FIG. 14 shows a potential structure of a DMS track having more than three converters. A DMS track having seven converters W1 to W7 is shown, where the upward facing connections of the converters W2, W4 and W6 can, for example, be connected to a common node, whereby the corresponding converters are connected to each other in parallel. These converters then can serve as input or output converters. The downward facing connections of the four other converters W1, W3, W5 and W7 can serve as coupling converters. In the shown arrangement with seven converters per DMS track, the converters functioning as coupling converters can also be operated in phase and/or synchronously. It is, however, advantageous to operate the coupling converters in anti-phase, whereby two adjacent converters can be respectively operated in anti-phase. However, it is also possible to operate the two left coupling converters in anti-phase to the right coupling converters.

Figure 15:
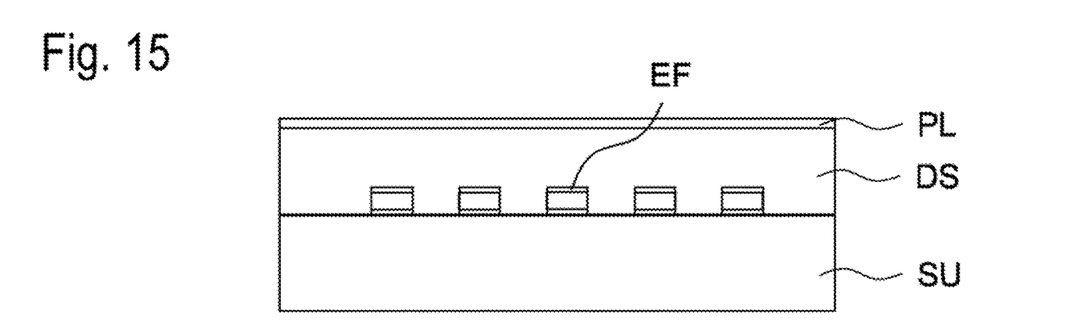
FIG. 15 illustrates a schematic cross section through a HQTCF filter on a lithium niobate substrate with a dielectric covering layer.

FIG. 15 shows a schematic cross section of a so called HQTCF filter, which is particularly suitable for the inventive filter arrangement. It is built on a substrate SU from lithium niobate, having, for example, a crystal cut that is suitable for the spreading of Raleigh waves.

The electrode fingers EF of the converters of the DMS track, which converters are shown only in sections, are preferably configured in multi-layer design, wherein some partial layers comprise Al, Cu or some similarly heavy metal.

Above the electrode fingers EF, a dielectric covering layer DS is applied, which has a temperature coefficient TCF of the center frequency that differs from the one of the substrate SU. Preferably, the temperature coefficients of the substrate SU and the dielectric covering layer DS are opposed to each other, which is achieved in an example, where the covering layer DS consists of silicon dioxide. The covering layer DS can be coated with a passivation layer PL, e.g. a thin silicon nitride layer, in order to be protected from humidity and/or corrosion.

The use of HQTCF filters in DMS technology has the following benefit: with filters on this substrate material and/or having this structure depicted here, no bulk waves can be created as parasitic modes, which bulk waves could result in an interfering signal or in additional losses in the adjacent frequency band of the second (first) filter. Hence, the use of HQ TCF filters for a parallel connection of two DMS filters with passbands adjacent to each other is particularly beneficial. These filters effectively reduce the losses in the upper part of the passband. Additionally, the value of the reflection factor of such a filter outside the passband is much closer to the value 1 and thus creates far less losses there than a filter designed according to another technology. Therefore, an HQTCF filter is particularly suitable for multiplexing several filters.

Although the invention was explained with reference to only a few exemplary embodiments, it is not limited to the depicted embodiments and design examples. New subcombinations of details and characteristics from different figures are also considered to be part of the invention.

LIST OF REFERENCE SIGNS

C1, C2, . . . parallel capacitances
DS dielectric covering layer
EF converter finger
F1, F2 DMS filter
F1, F2 first and second filter
f1, f2 center frequency
FA filter arrangement
K1, K2 node
L1, L2 coils
RS series resonator
S,S1,S11,S21,S22,S2 DMS tracks
SU substrate
TCF temperature coefficient
W1, W3 coupling converter
W2 output converter
S_21 transmission function of filter

What is claimed is:

1. A filter arrangement, comprising:
   a first double mode surface acoustic wave (DMS) filter; and
   a second DMS filter, wherein:
      the first DMS filter and the second DMS filter are connected to each other in parallel between a first node and a second node of the filter arrangement;
      each of the first DMS filter and the second DMS filter comprises two DMS tracks, connected in series;
      a center frequency of the first DMS filter is larger than a center frequency of the second DMS filter;
      a first DMS track of the two DMS tracks of the first DMS filter and a second DMS track of the two DMS tracks of the first DMS filter each comprises an input or output converter and at least a first coupling converter and a second coupling converter;
      the input or output converter of the first DMS track is coupled with the first coupling converter of the first DMS track via a first capacitive element and with the second coupling converter of the first DMS track via a second capacitive element; and
      the input or output converter of the second DMS track is coupled with the first coupling converter of the second DMS track via a third capacitive element and with the second coupling converter of the second DMS track via a fourth capacitive element.

2. The filter arrangement according to claim 1, further comprising a serial resonator connected in series to the first DMS filter and the second DMS filter.

3. The filter arrangement according to any of the preceding claims, wherein:
   the two DMS tracks of the first DMS filter are connected to each other via the first and second coupling converters;
   the two DMS tracks of the second DMS filter are connected to each other via two or more coupling converters; and
   for each DMS track of the first DMS filter and the second DMS filter, the coupling converters are arranged in phase opposition, and earth connections of the coupling converters are connected to each other but not to an external potential.

4. The filter arrangement according to claim 1, wherein each DMS track of the first DMS filter and the second DMS filter is structured as a metallization on at least one lithium niobate substrate and coated with a dielectric covering layer, which is positioned directly on top of the metallization.

5. The filter arrangement according to claim 4, wherein the dielectric covering layer has a temperature coefficient TCF that is lower than that of the substrate or is opposed to that of the substrate.

6. The filter arrangement according to claim 1, wherein, parallel to each of the first node and the second node of the filter arrangement, a coil is respectively connected to ground.

7. The filter arrangement according to claim 1, wherein a finger connection sequence in the two DMS tracks of the first DMS filter is selected such that, at least in one instance, two adjacent terminal converter fingers of different coupling converters are potential-carrying converter fingers.

8. The filter arrangement according to claim 1, further comprising:
   a balanced port, wherein each of the first DMS filter and the second DMS filter at the balanced port has two anti-phase output converters or one V-split converter, which comprises two partial converters that are arranged side by side in longitudinal direction and that are electrically connected to each other in parallel.

9. A method, comprising:
   using a filter arrangement as a receive filter, the filter arrangement comprising:
   a first double mode surface acoustic wave (DMS) filter; and
   a second DMS filter, wherein:
      the first DMS filter and the second DMS filter are connected to each other in parallel between a first node and a second node of the filter arrangement;
      each of the first DMS filter and the second DMS filter comprises two DMS tracks connected in series;
      a center frequency of the first DMS filter is larger than a center frequency of the second DMS filter;
      a first DMS track of the two DMS tracks of the first DMS filter and a second DMS track of the two DMS tracks of the first DMS filter each comprises an input or output converter and at least a first coupling converter and a second coupling converter;
      the input or output converter of the first DMS track is coupled with the first coupling converter of the first DMS track via a first capacitive element and with the second coupling converter of the first DMS track via a second capacitive element; and
      the input or output converter of the second DMS track is coupled with the first coupling converter of the second DMS track via a third capacitive element and with the second coupling converter of the second DMS track via a fourth capacitive element operating the receive filter for two adjacent bands; and
   performing, via the receive filter, simultaneous reception in the two bands within a Carrier Aggregation mode.

* * * * *